(12) United States Patent
Zou et al.

(10) Patent No.: US 10,873,146 B2
(45) Date of Patent: *Dec. 22, 2020

(54) HIGH-DENSITY AND HIGH-POWER CARD CONNECTION TERMINAL AND CONNECTOR

(71) Applicant: Amphenol Commercial Products (ChengDu) Co.LTD, Chengdu (CN)

(72) Inventors: Chao Zou, Chengdu (CN); Rongzhe Guo, Chengdu (CN)

(73) Assignee: AMPHENOL COMMERCIAL PRODUCTS (CHENGDU) CO.LTD, CHENGDU (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/698,953

(22) Filed: Nov. 28, 2019

(65) Prior Publication Data

US 2020/0212616 A1 Jul. 2, 2020

Related U.S. Application Data

(63) Continuation of application No. 16/234,623, filed on Dec. 28, 2018, now Pat. No. 10,637,175.

(51) Int. Cl.
*H01R 13/24* (2006.01)
*H01R 12/72* (2011.01)

(52) U.S. Cl.
CPC ....... *H01R 13/2492* (2013.01); *H01R 12/721* (2013.01); *H01R 12/724* (2013.01); *H01R 12/727* (2013.01)

(58) Field of Classification Search
CPC .......... H01R 13/2492; H01R 12/721; H01R 12/724; H01R 12/727
USPC .......................................... 439/59
See application file for complete search history.

(56) References Cited

U.S. PATENT DOCUMENTS

| 5,605,464 | A | * | 2/1997 | Ikesugi | G01R 1/0408 |
| | | | | | 439/70 |
| 6,652,322 | B2 | * | 11/2003 | Ito | H01R 12/721 |
| | | | | | 439/637 |
| 7,637,783 | B2 | * | 12/2009 | Sasaoka | H01R 43/16 |
| | | | | | 439/637 |
| 8,480,434 | B2 | * | 7/2013 | Funayama | H01R 12/716 |
| | | | | | 439/637 |
| 8,550,855 | B2 | * | 10/2013 | Zhang | H01R 13/6477 |
| | | | | | 439/636 |
| 8,672,713 | B2 | * | 3/2014 | Tajiri | H01R 12/585 |
| | | | | | 439/630 |

(Continued)

*Primary Examiner* — Peter G Leigh
(74) *Attorney, Agent, or Firm* — Bayramoglu Law Offices LLC

(57) ABSTRACT

A connection terminal includes an insertion end portion, a tail portion, and a connection block. The insertion end portion includes at least two first terminals configured apart from each other. The first terminal includes a first pin and a second pin, and a length of the first pin is greater than the length of the second pin. Fixing ends of the first pin and the second pin contact each other and pass through the connection block to connect with the tail portion. Free ends of the first pin and the second pin are separated from each other, and are both bent and protruded toward an inner side of the insertion end portion, so as to form a first contact point and a second contact point at the free ends of the first pin and the second pin, respectively.

18 Claims, 7 Drawing Sheets

(56) References Cited

U.S. PATENT DOCUMENTS

| | | | |
|---|---|---|---|
| 9,190,753 B2* | 11/2015 | Takaki | H01R 12/716 |
| 9,196,986 B2* | 11/2015 | Tanaka | H01R 12/737 |
| 9,287,654 B2* | 3/2016 | Takaki | H01R 13/52 |
| 9,608,349 B2* | 3/2017 | Mashiyama | H01R 13/2457 |
| 9,935,385 B2* | 4/2018 | Phillips | H01R 12/716 |
| 9,966,679 B2* | 5/2018 | Xu | H01R 12/523 |
| 2002/0187666 A1* | 12/2002 | Harasawa | H01R 13/2442 |
| | | | 439/74 |
| 2017/0054241 A1* | 2/2017 | Sato | H01R 12/721 |
| 2017/0373419 A1* | 12/2017 | Lee | H01R 13/4226 |
| 2018/0097320 A1* | 4/2018 | Hashiguchi | H01R 24/60 |

* cited by examiner

HIGH-DENSITY AND HIGH-POWER CARD CONNECTION TERMINAL AND CONNECTOR

CROSS REFERENCE TO RELATED APPLICATIONS

This application is a continuation of application Ser. No. 16/234,623, filed on Dec. 28, 2018, which is based upon and claims priority to Chinese Patent Application No. CN201811382876.1, filed on Nov. 20, 2018, the entire contents of which are incorporated herein by reference.

TECHNICAL FIELD

The present invention relates to the technical field of connectors, in particular, to a high-density and high-power card connection terminal and connector.

BACKGROUND

The card connectors available now are usually designed with one row of gold finger terminals on each of the two sides, and the corresponding card to be inserted is also designed with one row of gold finger terminals on each of the two sides. In order to achieve higher power, the quantity of terminal is usually increased. As a result, the overall connector is longer and spatial structure of the product is larger, which is adverse to miniaturization production. Besides, in the existing connection terminals, the quantity of terminal is fixed, which cannot meet the demands of different customers.

SUMMARY

An objective of the present invention is to provide a high-density and high-power card connection terminal and connector, so as to solve the problems that the demands of transmission flux and structure miniaturization cannot be satisfied at the same time in the prior art, and there are few options for the connection terminal.

The technical solutions of the present invention proposed to solve the above technical problems are as follows.

A high-density and high-power card connection terminal includes: an insertion end portion, a tail portion connected to the insertion end portion, and a connection block configured at a joint of the insertion end portion and the tail portion; wherein, the insertion end portion includes at least two first terminals configured apart from each other, each of the two first terminals includes a first pin and a second pin respectively located in an outer side and an inner side of the insertion end portion, and a length of the first pin is greater than a length of the second pin; a fixing end of the first pin and a fixing end of the second pin contact each other and pass through the connection block to connect with the tail portion; a free end of the first pin and a free end of the second pin are separated from each other, and are both bent and protruded toward the inner side of the insertion end portion, thereby forming a first contact point and a second contact point at the free end of the first pin and the free end of the second pin, respectively.

Further, in a preferred embodiment of the present invention, the first pin includes a straight main body and a free end connected to the straight main body; the free end is hook-shaped; a protruded portion of the free end is located in the inner side of the insertion end portion; and an opening of the free end faces toward the connection block.

Further, in a preferred embodiment of the present invention, the first pin includes an arc-shaped main body and a free end connected to the arc-shaped main body; the free end is arc-shaped, and a protruded portion of the free end is located in the inner side of the insertion end portion; and a terminal of the free end extends away from the connection block in a direction toward the outer side of the insertion end portion.

Further, in a preferred embodiment of the present invention, the second pin includes an arc-shaped main body and a free end connected to the arc-shaped main body; the free end is arc-shaped, and a protruded portion of the free end is located in the inner side of the insertion end portion; and a terminal of the free end extends away from the connection block in a direction toward the outer side of the insertion end portion.

Further, in a preferred embodiment of the present invention, the terminal of the free end of the second pin extends in the direction towards the outer side of the insertion end portion to make the terminal of the free end of the second pin closer to the outer side of the insertion end portion compared with the first contact point.

Further, in a preferred embodiment of the present invention, the second pin includes a straight main body and a free end connected to the straight main body; the free end is hook-shaped; a protruded portion of the free end is located in the inner side of the insertion end portion; and an opening of the free end faces toward the connection block.

Further, in a preferred embodiment of the present invention, the connection block is a plastic block having at least a pair of mutually parallel contact surfaces; a shape of the connection block of the present invention may be a cuboid, a cube, a combination of a cuboid and a cube, a combination of two cubes, a combination of two cuboids, or other different structures, so long as there is at least one pair of mutually parallel contact surfaces perpendicular to a terminal insertion direction so that a plurality of connection terminals can be arranged in a row through the two contact surfaces of the connection block, thereby realizing modularization of the terminals.

Further, in a preferred embodiment of the present invention, the tail portion includes a second terminal corresponding to the first terminal; the second terminal includes a third pin connected to the first pin and a fourth pin connected to the second pin.

A high-density and high-power card connector includes a housing and the above-mentioned connection terminal; a plurality of the connection terminals are provided; and the plurality of connection terminals are arranged side by side in the housing.

The present invention has the following advantages.

Compared with the connection terminal in prior art, the connection terminal of the present invention includes an insertion end portion, a tail portion, and a connection block. The individual separated connection terminals are connected as a whole by the connection block to form a modular connection terminal device. In the present invention, the insertion end portion of the connection terminal is provided with two symmetrical first terminals. Each first terminal includes a first pin and a second pin, so as to form four contact points at the insertion end portion of the entire connection terminal. Therefore, such design doubles the existing two contact points in the same space, which increases the transmission flux of the connection terminals, and achieves the objectives of saving spaces and costs. Besides, in the present invention, the two symmetric first terminals are connected together through the connection block to form a modular structure. The quantity of connection terminals can be adjusted according to different demands of the transmission flux for customers, so that the options are diversified, and the application scope of the connection terminals is wider. Meanwhile, with the connection block, the stability of the overall connection terminal can be enhanced, and thus the service life of the entire connector can be prolonged.

The connection terminal of the present invention is shorter than the existing structure in length. With the same quantity of terminals, the length of the product can be reduced by about a half, and the quantity of contact points of each column contact terminal is increased from two to four, thereby achieving the objective of saving spaces and costs, and greatly improving the transmission capacity in the same space.

In the figures:
100—connection terminal;
110—insertion end portion;
111—first terminal;
112—first pin;
113—second pin;
114—first contact point;
115—second contact point;
116—fixing end;
117—free end;
120—tail portion;
121—second terminal;
122—third pin;
123—fourth pin;
130—connection block;
200—connector; and
210—housing.

DETAILED DESCRIPTION OF THE EMBODIMENTS

The principles and features of the present invention will be described hereinafter with reference to the drawings. The examples set forth are merely used to illustrate the present invention rather than limit the scope of the present invention.

Embodiment 1

Figure 1:
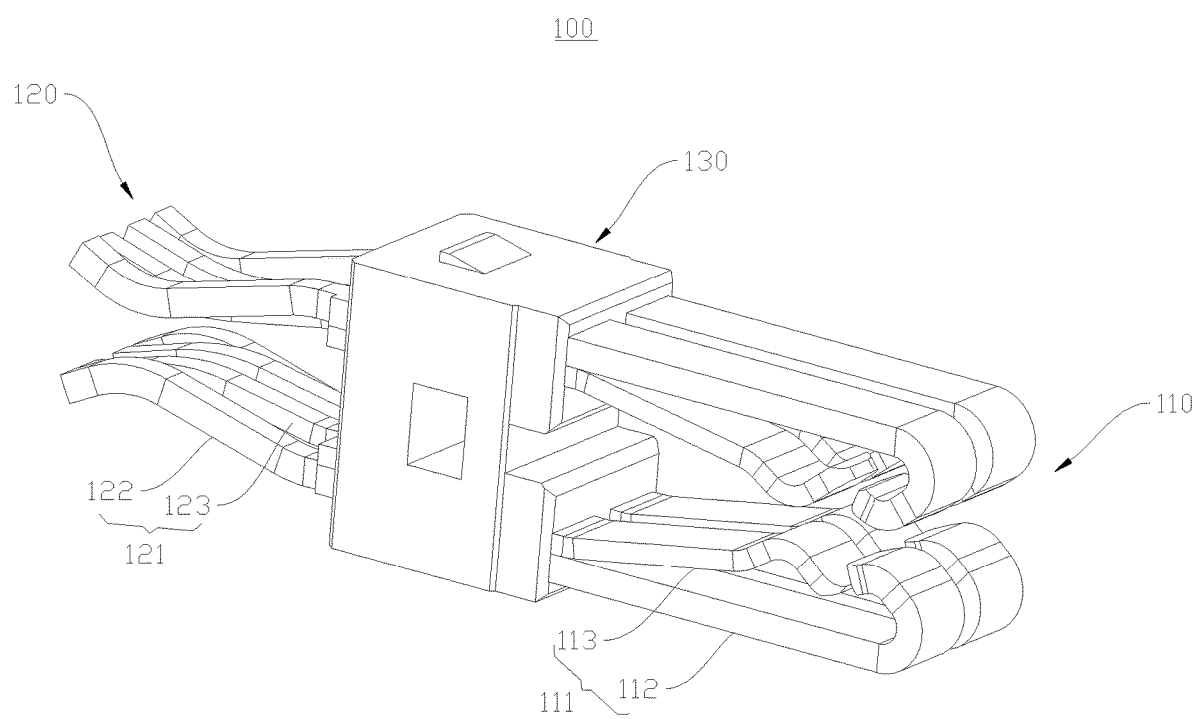
FIG. 1 is a structural schematic diagram showing a connection terminal of Embodiment 1 of the present invention.
Figure 7:
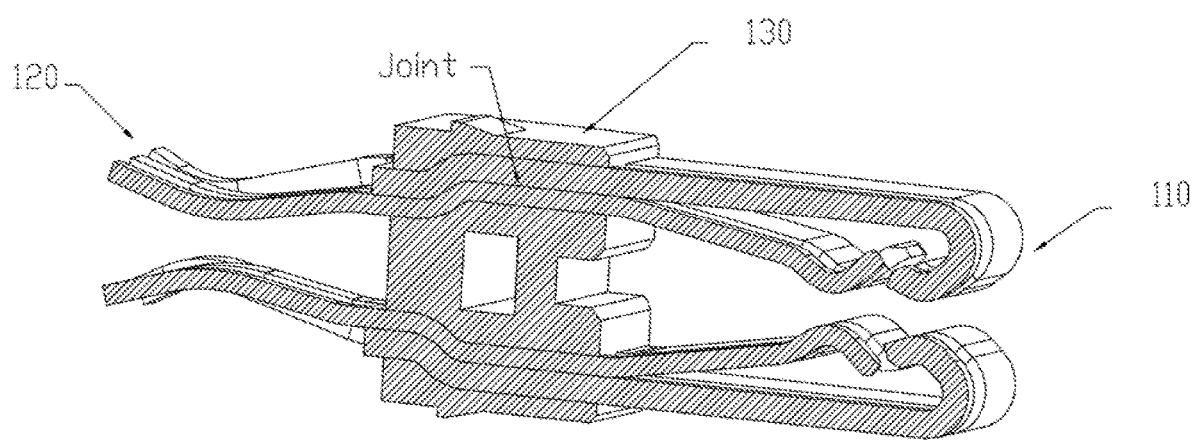
FIG. 7 is a cross-sectional view of FIG. 1 showing a joint of the insertion end portion and the tail portion.

Referring to FIG. 1, the high-density and high-power card connection terminal 100 includes an insertion end portion 110, a tail portion 120 connected to the insertion end portion 110, and a connection block 130 configured at a joint of the insertion end portion 110 and the tail portion 120. FIG. 7 is a cross-sectional view of FIG. 1 showing the joint of the insertion end portion 110 and the tail portion 120.

Figure 2:
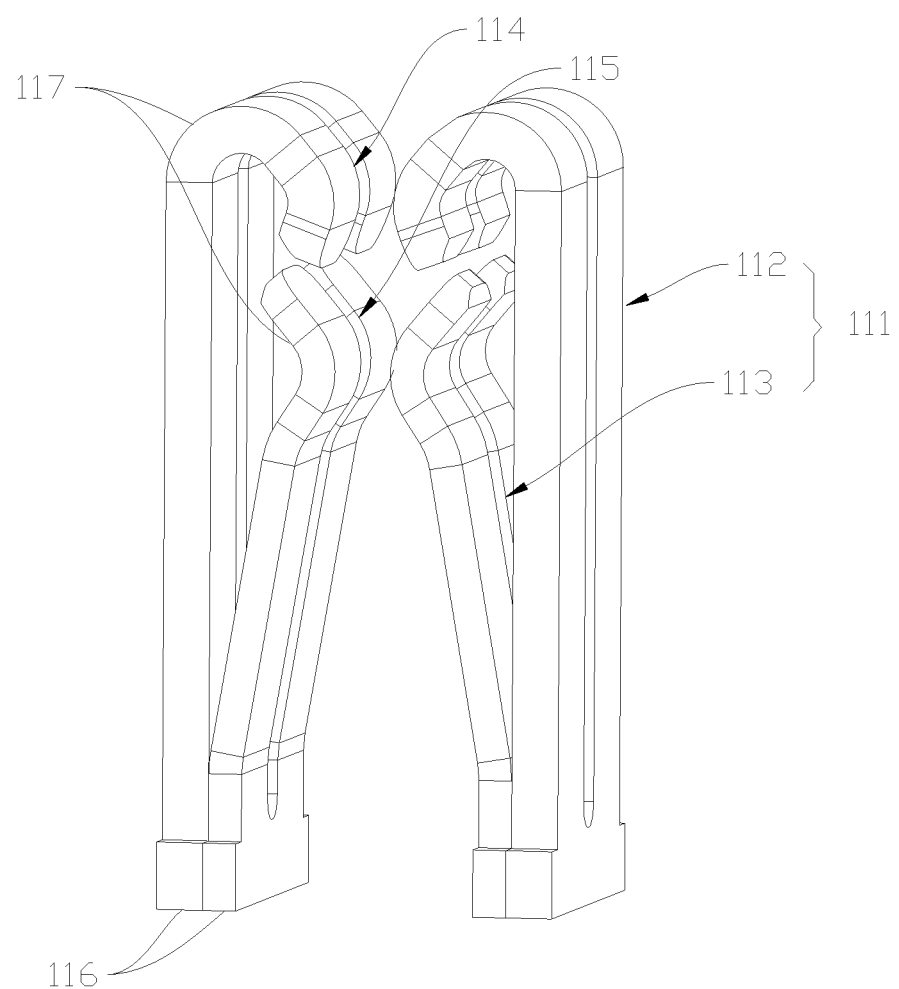
FIG. 2 is a structural schematic diagram showing an insertion end portion of a connection terminal of Embodiment 1 of the present invention.

Referring to FIG. 2, in the present embodiment, the insertion end portion 110 includes two first terminals 111 configured apart from each other. The two first terminals 111 are symmetrical to each other. In other embodiments of the present invention, more than two of the first terminals 111 may be included. The quantity of the first terminals 111 may be an even number arranged in pairs, e.g., four, or the quantity of the first terminals 111 may be an odd number e.g. three or more. Preferably, in the present invention, two first terminals 111 form a pair, so that customers can assemble the components according to different demands. The first terminal 111 includes a first pin 112 and a second pin 113 which are respectively located at an outer side and an inner side of the insertion end portion 110. The length of the first pin 112 is greater than the length of the second pin 113. As shown in FIG. 2, the first pin 112 and the second pin 113 are both thin pieces. Referring to FIG. 1 and FIG. 2, the fixing ends 116 of the first pin 112 and the second pin 113 contact each other and pass through the connection block 130 to connect with the tail portion 120. The free ends 117 of the first pin 112 and the second pin 113 are separated from each other, and are both bent and protruded toward the inner side of the insertion end portion 110, thereby forming a first contact point 114 and a second contact point 115 at the free ends 117 of the first pin 112 and the second pin 113 respectively.

As shown in FIG. 1 and FIG. 2, the first pin 112 includes a straight main body and a free end 117 connected to the straight main body. The free end 117 is hook-shaped. The protruded portion of the free end 117 is located in the inner side of the insertion end portion 110, and the opening of the free end 117 faces toward the connection block 130. The protruded portion of the hook-shaped free end 117 of the first pin 112 forms a first contact point for the transmission flux. The second pin 113 is configured obliquely relative to the first pin 112. The second pin 113 includes an arc-shaped main body and a free end 117 connected to the arc-shaped main body. The curvature of the bend of the arc-shaped main body of the second pin 113 is configured to ensure that the free end 117 of the second pin 113 would not touch the first pin 112. Moreover, the "arc shape" does not always refer to an arc shape, and is not only limited as a continuous arc segment, e.g. the arc shape may refer to one arc segment or multiple arc segments alternately formed on the main body of the second pin 113. The entire main body may further include a straight segment. A skilled person in the art may make proper adjustments as long as the condition when the first pin 112 and the second pin 113 is connected to each other at one end and separated from each other at another end is satisfied. As shown in FIG. 2, the free end 117 of the second pin 113 is arc-shaped, and the protruded portion of the free end 117 is located in the inner side the insertion end portion 110 to form a second contact point 115 for transmission flux. The end of the free end 117 of the second pin 113 extends in a direction away from the connection block 130. The terminal of the free end 117 of the second pin 113 extends toward the outer side of the insertion end portion 110, so that the terminal of the free end 117 of the second pin 113 is configured closer to the outer side of the insertion end portion 110 than the first contact point 114. The advantage of this configuration is that the free end 117 of the second pin 113 would be protected to avoid damages caused by a frontal impact with the card to be inserted during the insertion. In the view shown in FIG. 2, the terminal of the free end 117 of the second pin 113 is directed toward the inside of the hook of the first pin 112. Since the free end 117 of the first pin 112 is a hook shape bent downwards, the inserted card will not touch the terminal of the free end 117 of the first pin 112, which avoids a frontal impact of the card and the free end 117 of the second pin 113. Since the terminal of the second pin 113 is protected by the first pin 112, the inserted card will also not touch the second pin 113 and cause impact and loss, thereby increasing the service life of the entire connection terminal.

Referring to FIG. 1, in the present embodiment, the connection block 130 is a plastic rectangular block structure. In other embodiments of the invention, the connection block 130 may be replaced with a cube, or a combination of a cuboid and a cube. The cuboid and cubic connection blocks 130 are not only used to connect the two first terminals 111 in a pair, but also used to facilitate the arrangement and distribution of the terminals in a neat manner, so as to form a modular connection terminal 100.

Referring to FIG. 1, the tail portion 120 includes a second terminal 121 correspondingly configured according to the first terminal 111. The second terminal 121 includes a third pin 122 connected to the first pin 112 and a fourth pin 123 connected to the second pin 113. The quantity of the second terminal 121 of the tail portion 120 is matched with the quantity of the first terminal 111. The second terminal 121 is connected to the first terminal 111 to form a whole. The third pin 122 and the fourth pin 123 of each second terminal 121 are respectively connected to the first pin 112 and the second pin 113 of the corresponding first terminal 111. As shown in FIG. 1, in the present embodiment, the two symmetrical second terminals 121 are curved structures. The third pin 122 and the fourth pin 123 have the same curvature of bend.

Embodiment 2

Figure 3:
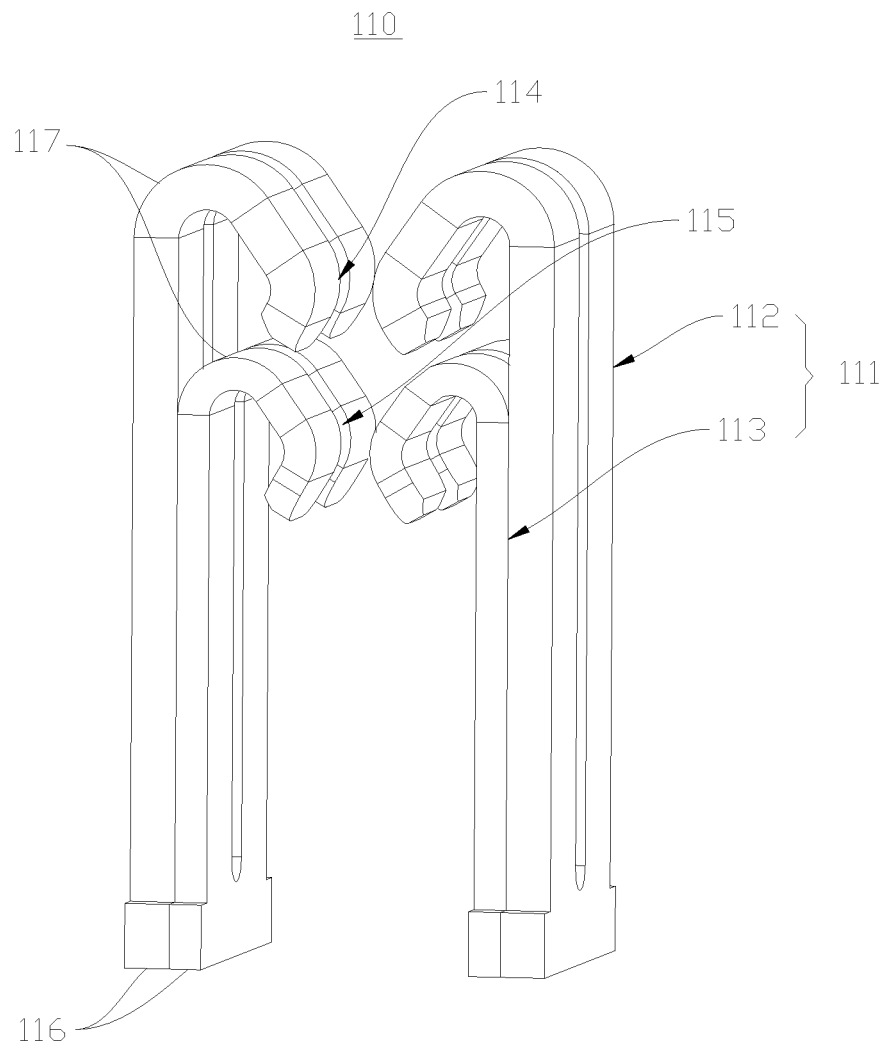
FIG. 3 is a structural schematic diagram showing an insertion end portion of a connection terminal of Embodiment 2 of the present invention.

Referring to FIG. 3, the structure of the connection terminal 100 of the present embodiment is substantially the same as that of Embodiment 1, except that the structure of the first terminal 111 of the insertion end portion 110 is different. Specifically, the structures of the first pin 112 and the second pin 113 are different.

As shown in FIG. 3, the first pin 112 of the present embodiment includes a straight main body and a free end 117 connected to the straight main body. The free end 117 is hook-shaped. The protruded portion of the free end 117 is located in the inner side of the insertion end portion 110, and the opening of the free end 117 faces toward the connection block 130. The second pin 113 has the same structure as the first pin 112. The second pin 113 also includes a straight main body and a free end 117 connected to the straight main body. The free end 117 is hook-shaped. The protruded portion of the free end 117 is located in the inner side of the insertion end portion 110, and the opening of the free end 117 faces toward the connection block 130. In the view shown in FIG. 3, the straight main body portions of the first pin 112 and the second pin 113 overlap with each other, and the free ends 117 thereof both have a hook shape bent downward. Since the terminals of the free ends 117 of the first pin 112 and the second pin 113 are faced toward the same direction as the insertion direction, i.e. downward direction, a frontal impact of the inserted card and the terminals of the free end 117 of the pins during insertion can be avoided, thereby reducing the possibility of pin deformation caused by the impact.

Embodiment 3

Figure 4:
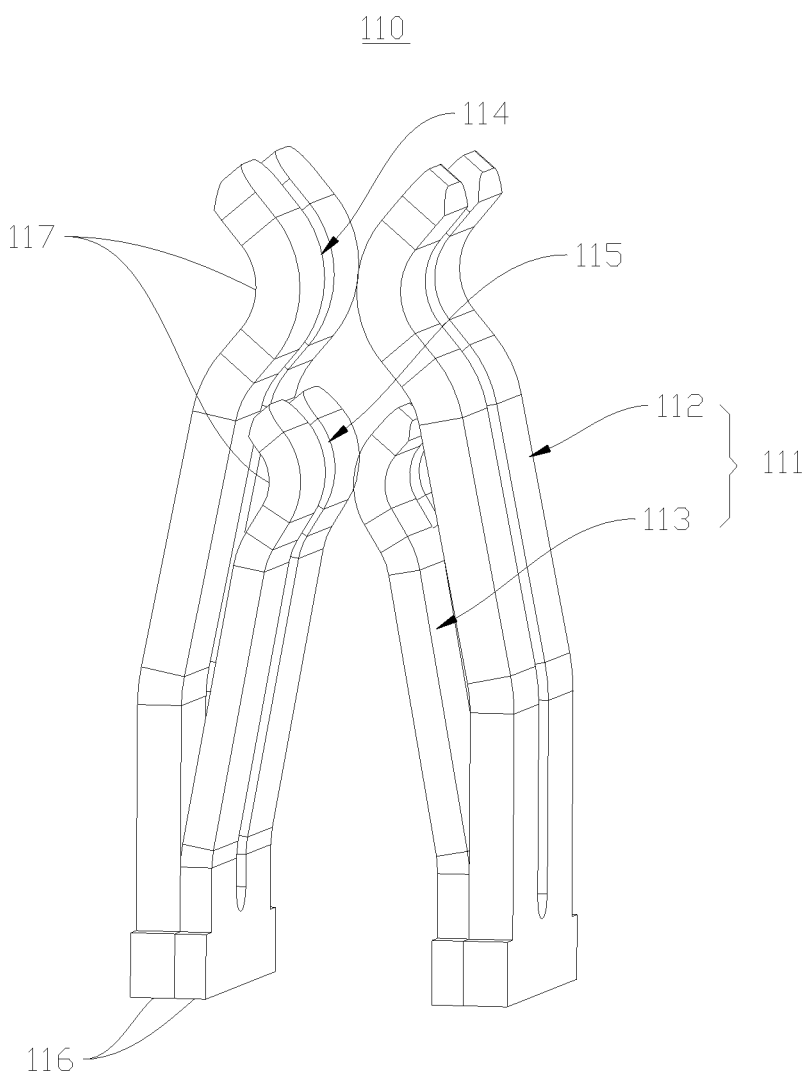
FIG. 4 is a structural schematic diagram showing an insertion end portion of a connection terminal of Embodiment 3 of the present invention.

Referring to FIG. 4, the structure of the connection terminal 100 of the present embodiment is substantially the same as that of Embodiment 1 and Embodiment 2, except that the structure of the first terminal 111 of the insertion end portion 110 is different. Specifically, the structures of the first pin 112 and the second pin 113 are different.

As shown in FIG. 4, the first pin 112 includes an arc-shaped main body and a free end 117 connected to the arc-shaped main body. The free end 117 is arc-shaped. The protruded portion of the free end 117 is located in the inner side of the insertion end portion 110. The terminal of the free end 117 extends in a direction away from the connection block 130 and towards the outer side of the insertion end portion 110, namely, the upper-right and upper-left directions that the free end 117 extends toward in FIG. 4. The second pin 113 is substantially the same as the first pin 112 in structure. The second pin 113 also includes an arc-shaped main body and a free end 117 connected to the arc-shaped main body. The free end 117 is arc-shaped. The protruded portion of the free end 117 is located in the inner side of the insertion end portion 110. The terminal of the free end 117 extends in the direction away from the connection block 130 and towards the outer side of the insertion end portion. In the view shown in FIG. 4, the free ends 117 of the first pin 112 and the second pin 113 both extend obliquely upward in the direction toward the outer side of the connection terminal 100, so that a frontal impact with the inserted card will not occur during the insertion.

Embodiment 4

Figure 5:
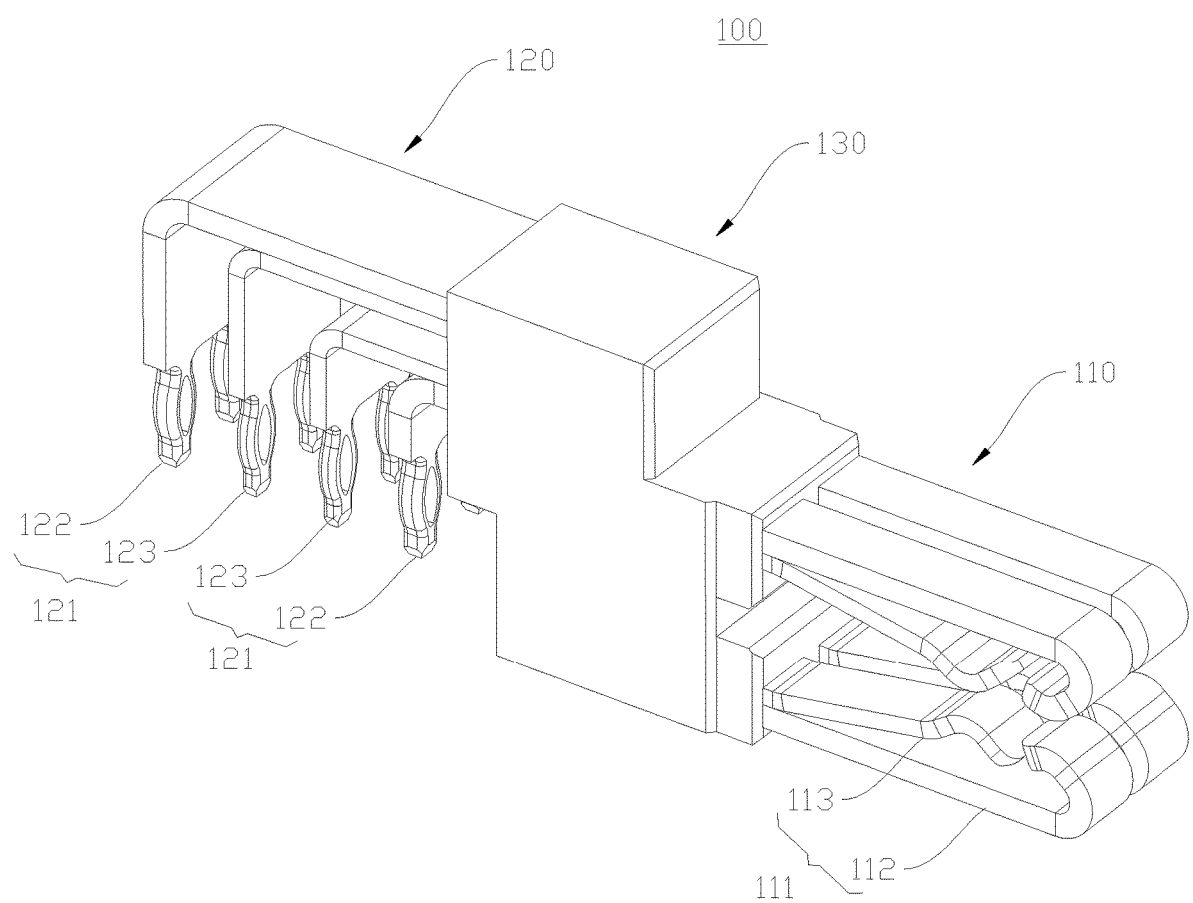
FIG. 5 is a structural schematic diagram showing a connection terminal of Embodiment 4 of the present invention.

Referring to FIG. 5, the structure of the connection terminal 100 of the present embodiment is substantially the same as that of Embodiment 1, except that the structure of the tail portion 120 is different. As shown in FIG. 5, in the present embodiment, the two second terminals 121 of the tail portion 120 are arranged side by side. Four pins, i.e. two third pins 122 and two fourth pins 123, are parallel to each other. Each pin is L-shaped, and is connected to the first pin 112 and the second pin 113 corresponding to the respective pin.

In other embodiments of the present invention, the second terminal 121 of the tail portion 120 may also be other shapes. A skilled person in the art can make adjustments according to practical applications. The tail portion 120 of the present invention includes, but is not limited to, the structures shown in FIG. 5 and FIG. 1.

Embodiment 5

Figure 6:
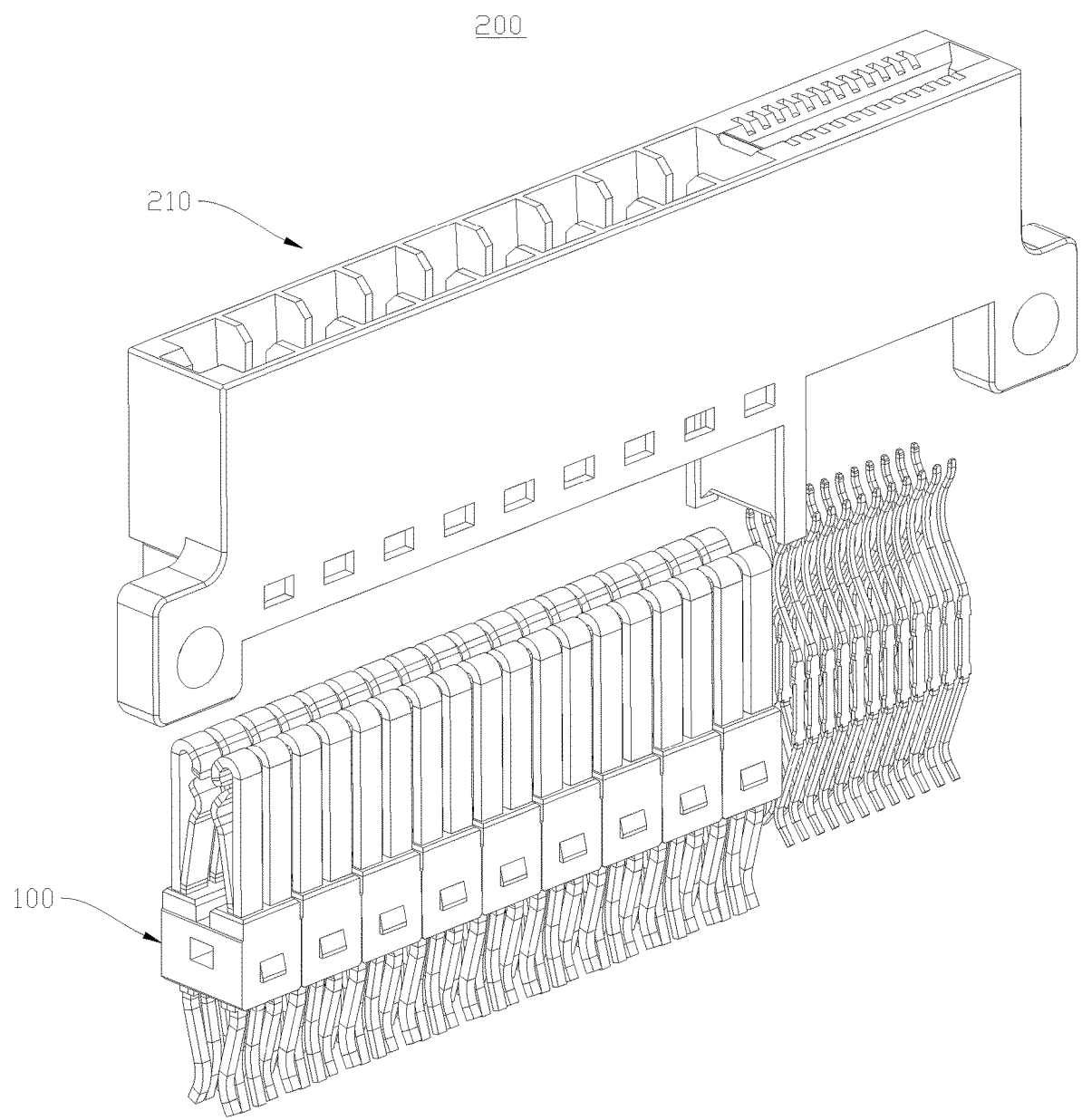
FIG. 6 is a structural schematic diagram showing a connector of Embodiment 5 of the present invention.

Referring to FIG. 6, the high-density and high-power card connector 200 of the present embodiment includes a housing 210 and the connection terminal 100 of Embodiment 1 described above. Multiple connection terminals 100 are provided. A plurality of connection terminals 100 are arranged side by side inside the housing 210. The quantity of the connection terminal 100 may be set according to the desired transmission flux, for example, the quantity of the connection terminal 100 may be five, six, seven, or even more. The transmission flux in the present invention refers to a current flux or an electrical signal flux expressed by current.

In other embodiments of the present invention, the connection terminal 100 applied in the high-density and high-power card connector 200 may also be the structure of the connection terminal 100 according to Embodiment 2 or Embodiment 3.

The above embodiments are merely some preferred embodiments of the present invention, which are not intended to limit the present invention. Any modifications, equivalent substitutions, and improvements, etc. derived within the spirit and principle of the present invention should be considered to fall within the scope of the present invention.

What is claimed is:

1. A high-density and high-power card connection terminal, comprising:
   an insertion end portion;
   a tail portion connected to the insertion end portion; and
   a connection block configured at a joint of the insertion end portion and the tail portion, wherein the connection block is a plastic block having at least a pair of mutually parallel contact surfaces, wherein the insertion end portion comprises at least two first terminals configured apart from each other; wherein each of the two first terminals comprises:
   a first pin and a second pin respectively located in an outer side and an inner side of the insertion end portion;
   a length of the first pin is greater than a length of the second pin;
   a fixing end of the first pin and a fixing end of the second pin contact each other and connect with the tail portion and the contact is located within the connection block;
   a free end of the first pin and a free end of the second pin are separated from each other, and are both bent and protruded toward the inner side of the insertion end portion to form a first contact point and a second contact point at the free end of the first pin and the free end of the second pin, respectively;
   wherein the free end of the first pin and the free end of the second pin are not located within the connection block.

2. The high-density and high-power card connection terminal according to claim 1, wherein
   the first pin comprises a straight main body and the free end of the first pin connected to the straight main body;
   the free end of the first pin is hook-shaped;
   a protruded portion of the free end of the first pin is located in the inner side of the insertion end portion; and
   an opening of the free end of the first pin faces toward the connection block.

3. The high-density and high-power card connection terminal according to claim 2, wherein
   the second pin comprises an arc-shaped main body and the free end of the second pin connected to the arc-shaped main body;
   the free end of the second pin is arc-shaped, and a protruded portion of the free end of the second pin is located in the inner side of the insertion end portion; and
   a terminal of the free end of the second pin extends away from the connection block in a direction toward the outer side of the insertion end portion.

4. The high-density and high-power card connection terminal according to claim 3, wherein the terminal of the free end of the second pin extends in the direction toward the outer side of the insertion end portion to make the terminal of the free end of the second pin closer to the outer side of the insertion end portion compared with the first contact point.

5. The high-density and high-power card connection terminal according to claim 2, wherein
   the second pin comprises a straight main body and the free end of the second pin connected to the straight main body;
   the free end of the second pin is hook-shaped;
   a protruded portion of the free end of the second pin is located in the inner side of the insertion end portion; and
   an opening of the free end of the second pin faces toward the connection block.

6. The high-density and high-power card connection terminal according to claim 1, wherein
   the first pin comprises an arc-shaped main body and the free end of the first pin connected to the arc-shaped main body;
   the free end of the first pin is arc-shaped, and a protruded portion of the free end of the first pin is located in the inner side of the insertion end portion; and
   a terminal of the free end of the first pin extends away from the connection block in a direction toward the outer side of the insertion end portion.

7. The high-density and high-power card connection terminal according to claim 6, wherein
   the second pin comprises an arc-shaped main body and the free end of the second pin connected to the arc-shaped main body;
   the free end of the second pin is arc-shaped, and a protruded portion of the free end of the second pin is located in the inner side the insertion end portion; and
   a terminal of the free end of the second pin extends away from the connection block in a direction toward the outer side of the insertion end portion.

8. The high-density and high-power card connection terminal according to claim 7, wherein the terminal of the free end of the second pin extends in the direction toward the outer side of the insertion end portion to make the terminal of the free end of the second pin closer to the outer side of the insertion end portion compared with the first contact point.

9. A high-density and high-power card connection terminal, comprising:
   an insertion end portion;
   a tail portion connected to the insertion end portion; and
   a connection block configured at a joint of the insertion end portion and the tail portion, wherein the insertion end portion comprises at least two first terminals configured apart from each other; wherein each of the two first terminals comprises:
   a first pin and a second pin respectively located in an outer side and an inner side of the insertion end portion;
   a length of the first pin is greater than a length of the second pin;
   a fixing end of the first pin and a fixing end of the second pin contact each other and connect with the tail portion and the contact is located within the connection block;
   a free end of the first pin and a free end of the second pin are separated from each other, and are both bent and protruded toward the inner side of the insertion end portion to form a first contact point and a second contact point at the free end of the first pin and the free end of the second pin, respectively;
   wherein the free end of the first pin and the free end of the second pin are not located within the connection block;

wherein the tail portion comprises a second terminal corresponding to the first terminal; and the second terminal comprises a third pin connected to the first pin and a fourth pin connected to the second pin.

10. A high-density and high-power card connector comprising a housing and a connection terminal comprising: an insertion end portion; a tail portion connected to the insertion end portion; and a connection block configured at a joint of the insertion end portion and the tail portion, wherein the connection block is a plastic block having at least a pair of mutually parallel contact surfaces, wherein the insertion end portion comprises a plurality of connection terminals configured apart from each other, wherein the plurality of connection terminals are arranged side by side in the housing;

each of the plurality of connection terminals comprises: a first pin; and a second pin respectively located in an outer side and an inner side of the insertion end portion;
a length of the first pin is greater than a length of the second pin;
a fixing end of the first pin and a fixing end of the second pin contact each other and connect with the tail portion and the contact is located within the connection block;
a free end of the first pin and a free end of the second pin are separated from each other, and are both bent and protruded toward the inner side of the insertion end portion to form a first contact point and a second contact point at the free end of the first pin and the free end of the second pin, respectively;
wherein the free end of the first pin and the free end of the second pin are not located within the connection block.

11. The high-density and high-power card connector according to claim 10, wherein
the first pin comprises a straight main body and the free end of the first pin connected to the straight main body;
the free end of the first pin is hook-shaped;
a protruded portion of the free end of the first pin is located in the inner side of the insertion end portion; and
an opening of the free end of the first pin faces toward the connection block.

12. The high-density and high-power card connector according to claim 11, wherein
the second pin comprises an arc-shaped main body and the free end of the second pin connected to the arc-shaped main body;
the free end of the second pin is arc-shaped, and a protruded portion of the free end of the second pin is located in the inner side the insertion end portion; and
a terminal of the free end of the second pin extends away from the connection block in a direction toward the outer side of the insertion end portion.

13. The high-density and high-power card connector according to claim 12, wherein the terminal of the free end of the second pin extends in the direction toward the outer side of the insertion end portion to make the terminal of the free end of the second pin closer to the outer side of the insertion end portion compared with the first contact point.

14. The high-density and high-power card connector according to claim 11, wherein the second pin comprises a straight main body and the free end of the second pin connected to the straight main body;
the free end of the second pin is hook-shaped;
a protruded portion of the free end of the second pin is located in the inner side of the insertion end portion; and
an opening of the free end of the second pin faces toward the connection block.

15. The high-density and high-power card connector according to claim 10, wherein
the first pin comprises an arc-shaped main body and the free end of the first pin connected to the arc-shaped main body;
the free end of the first pin is arc-shaped, and a protruded portion of the free end of the first pin is located in the inner side of the insertion end portion; and
a terminal of the free end of the first pin extends away from the connection block in a direction toward the outer side of the insertion end portion.

16. The high-density and high-power card connector according to claim 15, wherein
the second pin comprises an arc-shaped main body and the free end of the second pin connected to the arc-shaped main body;
the free end of the second pin is arc-shaped, and a protruded portion of the free end of the second pin is located in the inner side the insertion end portion; and
a terminal of the free end of the second pin extends away from the connection block in a direction toward the outer side of the insertion end portion.

17. The high-density and high-power card connector according to claim 16, wherein the terminal of the free end of the second pin extends in the direction toward the outer side of the insertion end portion to make the terminal of the free end of the second pin closer to the outer side of the insertion end portion compared with the first contact point.

18. The high-density and high-power card connection terminal according to claim 10, wherein the tail portion comprises a second terminal corresponding to the first terminal; and the second terminal comprises a third pin connected to the first pin and a fourth pin connected to the second pin.

* * * * *